United States Patent
Lin et al.

(10) Patent No.: US 10,269,668 B2
(45) Date of Patent: Apr. 23, 2019

(54) SYSTEM AND METHOD FOR BONDING PACKAGE LID

(71) Applicant: Taiwan Semiconductor Manufacturing Company, Ltd., Hsinchu (TW)

(72) Inventors: Shih-Yen Lin, New Taipei (TW); Yu-Chih Liu, Taipei (TW); Chin-Liang Chen, Kaohsiung (TW); Wei-Ting Lin, Taipei (TW); Kuan-Lin Ho, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 41 days.

(21) Appl. No.: 15/613,815

(22) Filed: Jun. 5, 2017

(65) Prior Publication Data
US 2017/0271223 A1 Sep. 21, 2017

Related U.S. Application Data

(62) Division of application No. 14/163,000, filed on Jan. 24, 2014, now Pat. No. 9,673,119.

(51) Int. Cl.
*H01L 21/44* (2006.01)
*H01L 23/10* (2006.01)
(Continued)

(52) U.S. Cl.
CPC ............ *H01L 23/10* (2013.01); *H01L 21/563* (2013.01); *H01L 23/04* (2013.01);
(Continued)

(58) Field of Classification Search
CPC ............ H01L 21/563; H01L 21/76843; H01L 21/76879; H01L 21/76883; H01L 23/10; H01L 23/3675; H01L 23/585; H01L 23/04; H01L 23/3142; H01L 23/49816; H01L 24/16; H01L 24/05; H01L 24/83; H01L 24/73; H01L 24/33; H01L 24/17;
(Continued)

(56) References Cited

U.S. PATENT DOCUMENTS

| | | | |
|---|---|---|---|
| 6,204,454 B1* | 3/2001 | Gotoh | H01L 23/10 156/153 |
| 2004/0188831 A1* | 9/2004 | Hsiao | H01L 23/10 257/719 |

(Continued)

*Primary Examiner* — (Vikki) Hoa B Trinh
(74) *Attorney, Agent, or Firm* — Slater Matsil, LLP

(57) ABSTRACT

Disclosed herein is a device having a shaped seal ring comprising a workpiece, the workpiece comprising at least one dielectric layer disposed on a first side of a substrate, a seal ring disposed in the at least one dielectric layer, and at least one groove in the seal ring. A lid is disposed over the workpiece, the workpiece extending into a recess in the lid and a first thermal interface material (TIM) contacts the seal ring and the lid, with the first TIM extending into the at least one groove. The workpiece is mounted to the package carrier. A die is mounted over a first side of workpiece and disposed in the recess. A first underfill a disposed under the die and a second underfill is disposed between the workpiece and the package carrier. The first TIM is disposed between the first underfill and the second underfill.

20 Claims, 13 Drawing Sheets

(51) Int. Cl.
- *H01L 23/04* (2006.01)
- *H01L 23/31* (2006.01)
- *H01L 21/56* (2006.01)
- *H01L 23/58* (2006.01)
- *H01L 23/367* (2006.01)
- H01L 23/00 (2006.01)
- H01L 25/065 (2006.01)
- H01L 25/18 (2006.01)
- H01L 23/498 (2006.01)

(52) U.S. Cl.
CPC ...... *H01L 23/3142* (2013.01); *H01L 23/3675* (2013.01); *H01L 23/585* (2013.01); H01L 23/49816 (2013.01); H01L 23/49827 (2013.01); H01L 24/03 (2013.01); H01L 24/05 (2013.01); H01L 24/06 (2013.01); H01L 24/11 (2013.01); H01L 24/13 (2013.01); H01L 24/16 (2013.01); H01L 24/17 (2013.01); H01L 24/32 (2013.01); H01L 24/33 (2013.01); H01L 24/73 (2013.01); H01L 24/83 (2013.01); H01L 24/92 (2013.01); H01L 25/0657 (2013.01); H01L 25/18 (2013.01); H01L 2224/03002 (2013.01); H01L 2224/0345 (2013.01); H01L 2224/03452 (2013.01); H01L 2224/0401 (2013.01); H01L 2224/05572 (2013.01); H01L 2224/05647 (2013.01); H01L 2224/05655 (2013.01); H01L 2224/05666 (2013.01); H01L 2224/06181 (2013.01); H01L 2224/11002 (2013.01); H01L 2224/131 (2013.01); H01L 2224/16145 (2013.01); H01L 2224/16147 (2013.01); H01L 2224/16225 (2013.01); H01L 2224/16237 (2013.01); H01L 2224/17181 (2013.01); H01L 2224/26145 (2013.01); H01L 2224/26175 (2013.01); H01L 2224/32145 (2013.01); H01L 2224/32225 (2013.01); H01L 2224/32245 (2013.01); H01L 2224/33181 (2013.01); H01L 2224/73203 (2013.01); H01L 2224/73204 (2013.01); H01L 2224/73253 (2013.01); H01L 2224/83385 (2013.01); H01L 2224/92125 (2013.01); H01L 2224/92225 (2013.01); H01L 2225/06513 (2013.01); H01L 2225/06517 (2013.01); H01L 2225/06541 (2013.01); H01L 2225/06568 (2013.01); H01L 2225/06589 (2013.01); H01L 2924/00 (2013.01); H01L 2924/1432 (2013.01); H01L 2924/1434 (2013.01); H01L 2924/1579 (2013.01); H01L 2924/15311 (2013.01); H01L 2924/15788 (2013.01); H01L 2924/164 (2013.01); H01L 2924/1615 (2013.01); H01L 2924/1631 (2013.01); H01L 2924/1632 (2013.01); H01L 2924/16152 (2013.01); H01L 2924/16235 (2013.01); H01L 2924/16251 (2013.01)

(58) Field of Classification Search
CPC ......... H01L 24/06; H01L 24/11; H01L 24/92; H01L 24/03; H01L 24/32
See application file for complete search history.

(56) References Cited

U.S. PATENT DOCUMENTS

| 2012/0241917 | A1  | 12/2012 | Ide et al. | |
|---|---|---|---|---|
| 2013/0093075 | A1* | 4/2013 | Liu | H01L 23/3114 257/712 |
| 2014/0027928 | A1* | 1/2014 | Watanabe | H01L 23/562 257/774 |

* cited by examiner

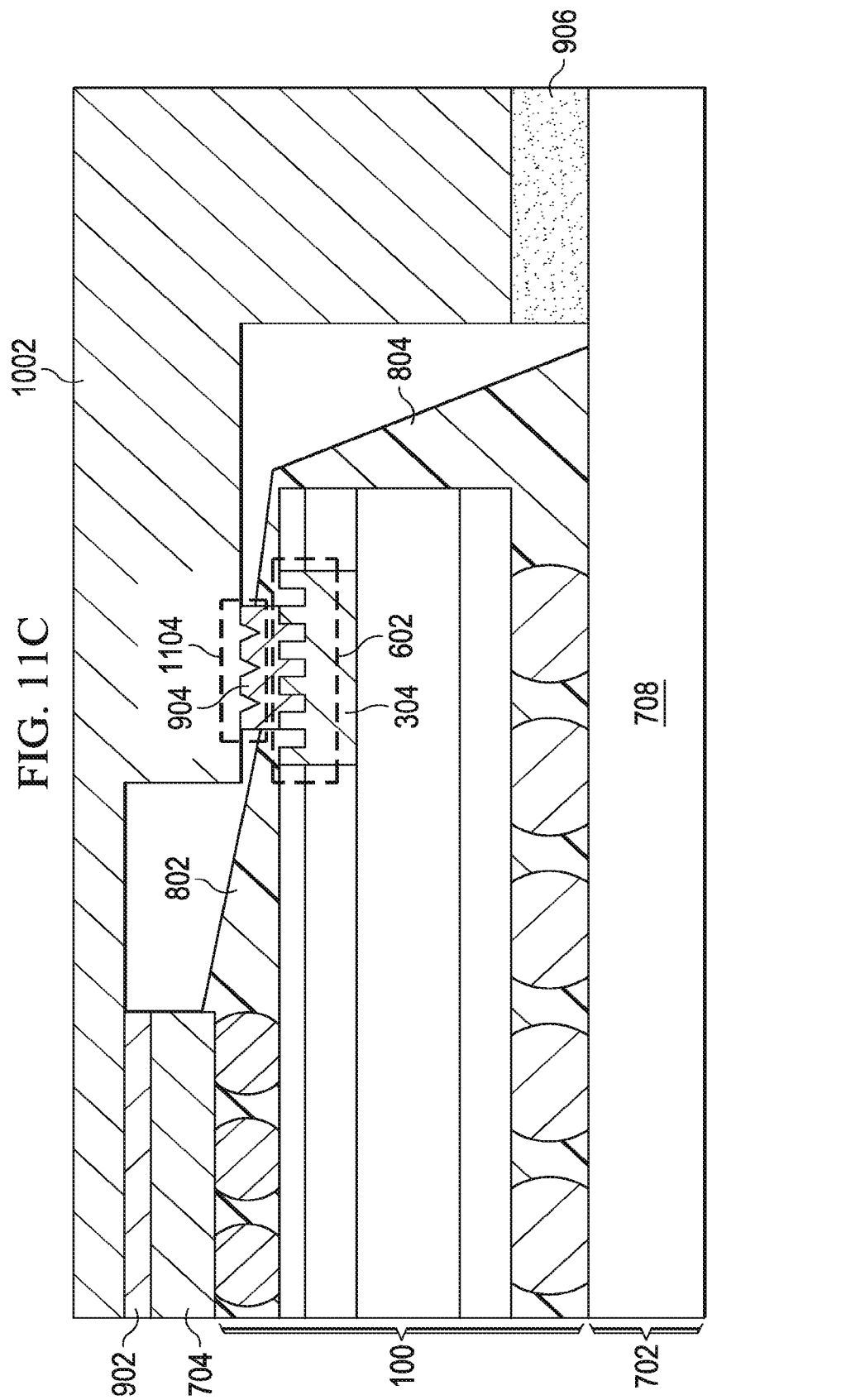

SYSTEM AND METHOD FOR BONDING PACKAGE LID

PRIORITY CLAIM AND CROSS-REFERENCE

This application is a divisional of and claims priority to U.S. patent application Ser. No. 14/163,000, filed on Jan. 24, 2014, entitled "System and Method for Bonding Package Lid," which application is hereby incorporated herein by reference in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. In some device, multiple dies are stacked vertically to reduce the footprint of a device package and permit dies with different processing technologies to be interconnected. As the sizes of active devices on a die shrink, the heat dissipation for the increasingly compact active devices is managed by attaching a lid over the stacked dies. The lid protects the dies and provides a path to conduct heat away from the dies.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 11A through 11C illustrate cross-sectional views of devices with various embodiments of shaped seal rings and lids.

Corresponding numerals and symbols in the different figures generally refer to corresponding parts unless otherwise indicated. The figures are drawn to illustrate the relevant aspects of the embodiments and are not necessarily drawn to scale.

DETAILED DESCRIPTION

The making and using of the presented embodiments are discussed in detail below. It should be appreciated, however, that the present disclosure provides many applicable concepts that can be embodied in a wide variety of specific contexts. The specific embodiments discussed are merely illustrative of specific ways to make and use the described device with a shaped seal ring and bonded lid, and do not limit the scope of the disclosure.

Embodiments will be described with respect to a specific context, namely making and using shaped seal rings useful in, for example, bonding lids, heat sinks covers, casing or the like to wafers, dies, substrates or other structures. Other embodiments may also be applied, however, to the bonding of substrates, packages, structures or devices or combinations of any type of integrated circuit device or component.

The embodiments of the present disclosure are described with reference to FIGS. 1 through 12, and variations of the embodiments are also discussed. Throughout the various views and illustrative embodiments of the present disclosure, like reference numbers are used to designate like elements. Additionally, the drawings are intended to be illustrative, are not to scale and not intended to be limiting. Note that, for simplification, not all element numbers are included in each subsequent drawing. Rather, the element numbers most pertinent to the description of each drawing are included in each of the drawings.

Three dimensional integrated circuit (3D IC) packages are commonly formed by attaching one or more top dies to carrier dies, which are in turn attached to a package substrate. These dies and substrate are attached by way of, for example, ball grid arrays (BGAs), land grid arrays (LGAs), solder balls, studs, wire bonds, or other conductive connectors. One or more of the dies may be formed with a seal ring in a redistribution layer (RDL) around the outside edge of the die. The seal ring may be formed of metal elements extending through the dielectric layers of the RDL. The seal ring prevents the dielectric layers from peeling, particularly when the die is sawn from the wafer.

In order to ensure that the stacked dies remain connected and the conductive connections between the dies remain intact an underfill is applied between each the dies. Disclosed herein is a method for shaping the top surface of the seal ring so that a lid acting as a heat sink may be applied over the dies with a thermal interface material (TIM) between the seal ring and the lid. It has been discovered that a grooved or shaped seal ring surface provides an improved bonding surface for the TIM that prevents underfill material on each side of the TIM from seeping between the TIM and the seal ring, weakening the bond and reducing the thermal interface between the seal ring and TIM.

Figure 1:
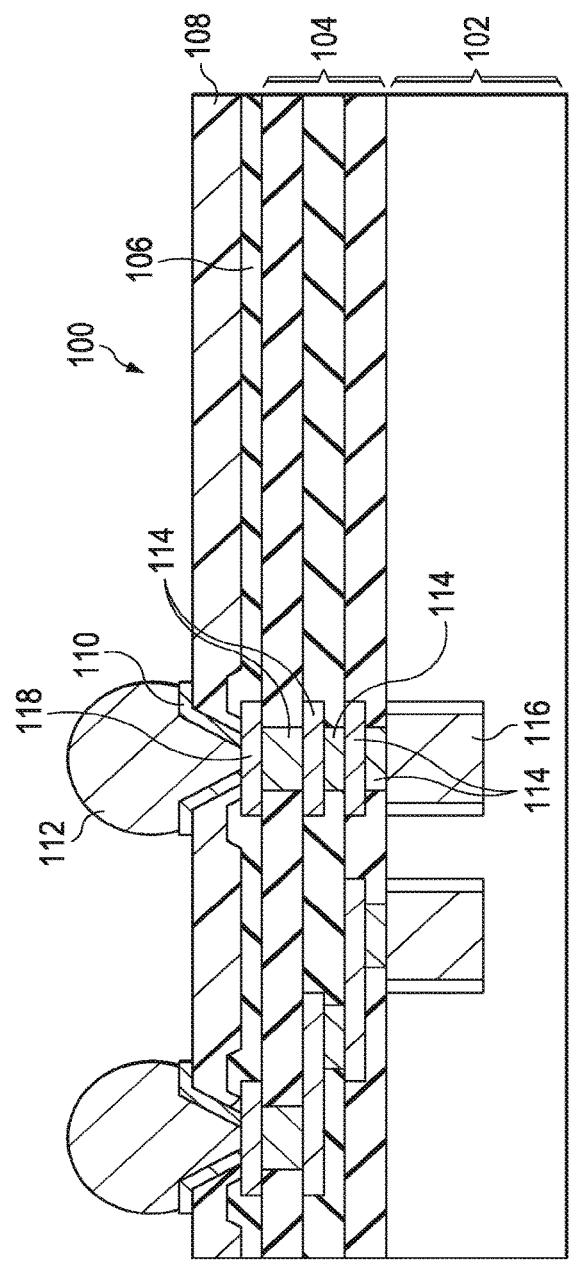
FIGS. 1 through 10 illustrate cross-sectional views of intermediate steps in forming a workpiece having a shaped seal ring according to an embodiment.

FIG. 1 is a cross-sectional view illustrating an intermediate step in formation of a workpiece 100 according to an embodiment. A workpiece 100 comprises a substrate 102 having one or more devices, vias 116 or structures formed therein. An RDL 104 with one or more dielectric layers is formed on the first side of the substrate 102, with one or more conductive features 114 disposed in the dielectric layers. Lands 118 are formed on the RDL 104, with the conductive features 114 connecting the lands 118 to the vias 116, devices or structures of the substrate 102. In an embodiment, a passivation layer 106 and a protective layer 108 are formed over the RDL 104, with openings exposing the lands 118. Under bump metal layers (UBMs) 110 are formed in the openings of the passivation layer 106 and the protective layer 108, and one or more connectors 112 are applied over the UBMs 110.

In an embodiment, the substrate 102 is a semiconductor, a polymer, an insulator, or the like. In some embodiments, the substrate 102 is a portion of a semiconductor wafer, and one or more active devices, such transistors, diodes, photosensors, or the like are formed in the body of, or on the surface of, the substrate 102. In other embodiments, the substrate 102 is an interposer, carrier or supporting structure made from, for example, a polymer, glass, or another insulating material.

In an embodiment, one or more conductive features are formed in or on the surface of the substrate 102. In an embodiment, conductive structures such as vias 116 are formed in the substrate 102. Here, the drawings illustrate vias 116 in the substrate 102 for simplicity. However, the drawings are intended to be exemplary and not limiting, as any combination of active devices, traces, passive devices, or one or more other structures may be disposed in or on the substrate 102.

The RDL 104 is formed with one or more metal layers and one or more intermetal dielectric layers (IMDs). The IMDs are disposed between the metal layers. The IMDs have conductive features 114 such as vias disposed in a dielectric connecting to conductive features 114 such as traces in the dielectric of the metal layers. In an embodiment, the dielectric material of the metal layers and IMDs is, for example, a silicon oxide, nitride, carbide, polymer, or another insulating or dielectric material, and may be formed using a chemical vapor deposition (CVD), spin-on or other deposition process. The conductive features 114 may be formed using a damascene or dual damascene process, with openings etched in the dielectric layer of the RDL 104, and a conductive material such as copper, aluminum, or the like deposited in the opening and then planarized. The RDL 104 is built up by forming multiple metal layers and IMDs, with the traces and vias routing electrical connections from structures on the substrate 102 to the top surface of the RDL 104.

Lands 118 are formed on top surface of the RDL 104 or are formed in the top layer of the RDL 104 as part of the RDL formation process. The lands 118 are configured to accept UBM structures or to accept direct application of a connector 112. In an embodiment, the lands 118 are formed from, for example, copper, aluminum, or another metal or conductive material.

The passivation layer 106 and protective layer 108 are formed over at least a portion of the lands 118 and over the top surface of the RDL 104. In an embodiment, the passivation layer 106 is formed from, for example, a nitride, an oxide, an oxynitride, a carbide such as silicon carbide, or another material, formed through a deposition, masking and etching process, or through a masking and deposition process. The protective layer 108 is from from a polymer such as polybenzoxazole (PBO), or an epoxy, polyimide or other material, which is applied over the passivation layer 106.

One or more UBMs 110 are formed in the openings in the protective layer 108 and passivation layer 106 with a process such as deposition, masking and etching. In an embodiment, the deposition process is CVD, sputtering, or the like, and the UBM material is a metal such as copper, nickel, titanium or the like. One or more connectors 112 are formed over the lands 118. In an embodiment, the connectors 112 are solder balls or connective bumps disposed on the UBMs 110. In another embodiment, the connectors 112 are studs, pins, wires or another structure formed on the land 118 with the UBMs 110 omitted.

Figure 2:
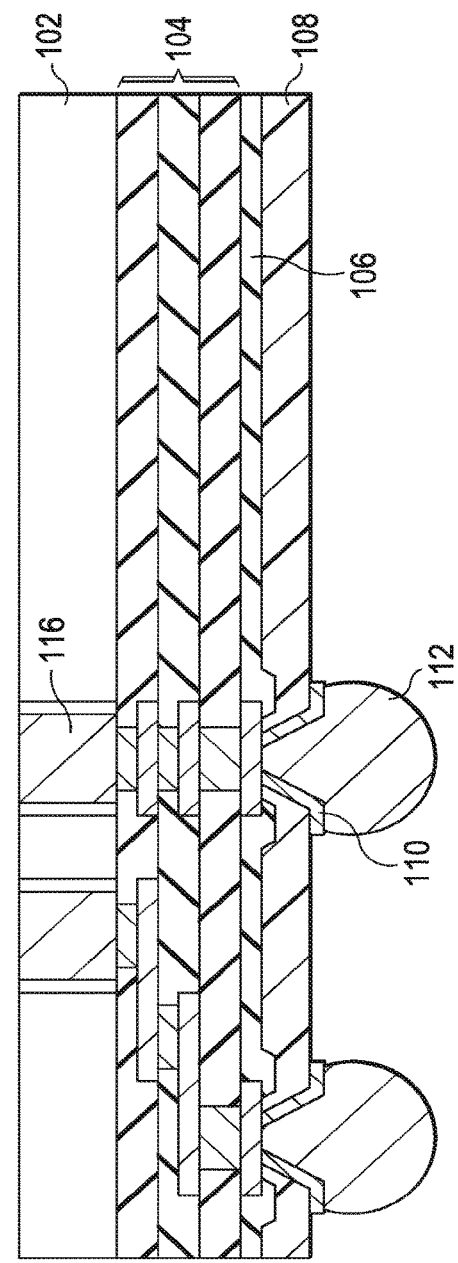

FIG. 2 is a cross-sectional view illustrating thinning of the backside of the substrate 102 according to an embodiment. The workpiece 100 is inverted to access the backside of the substrate 102. In an embodiment, the workpiece 100 is attached at the first side to a carrier (omitted for clarity) with an adhesive or the like. The carrier may be a support or other structure permitting handling and processing of the workpiece 100 in subsequent steps.

The backside of the substrate 102 is prepared for processing after bonding the workpiece 100 to the carrier, where used. In an embodiment, vias 116 formed in the substrate 102 are exposed by grinding or otherwise reducing the backside of the substrate 102. In another embodiment, the backside of the substrate 102 is planarized, cleaned or otherwise processed.

Figure 3:
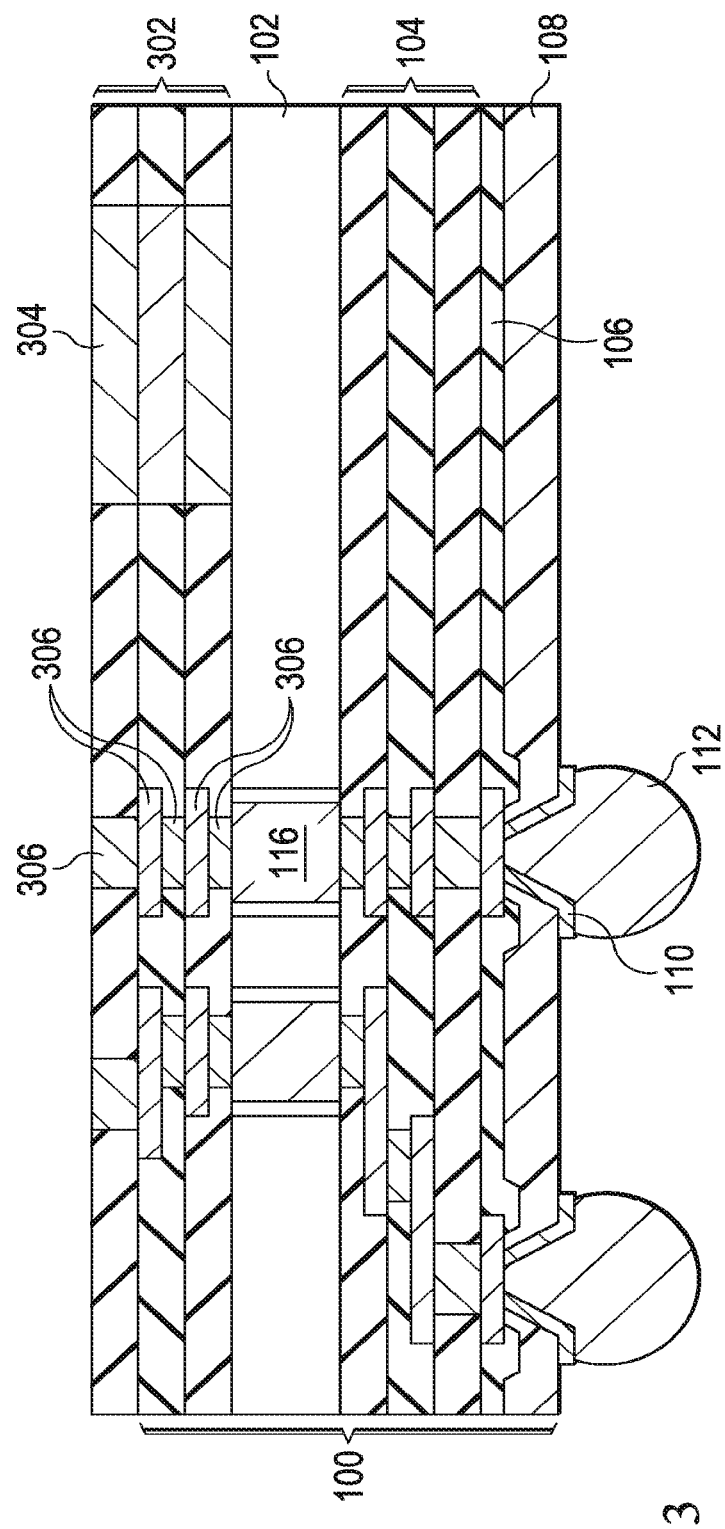

FIG. 3 is a cross-sectional view illustrating formation of a seal ring 304 on the workpiece 100 according to an embodiment. An RDL 302 is formed on the backside of the substrate 102 with formation processes such as those for the RDL 104 as described above for FIG. 1. The RDL 302 has a seal ring 304 formed therein bordering the outside edge of the workpiece 100. In an embodiment, the seal ring 304 is formed from metal elements created when the conductive elements 306 are formed in each dielectric layer of the RDL 302. In such an embodiment, the seal ring 304 may be build up from multiple stacked metal elements. For example, the conductive elements 306 and seal ring 304 elements may be formed from copper in dielectric layers made from silicon oxide, silicon nitride, silicon carbide or other dielectric material. In such an example, openings for the seal ring 304 may be formed in each dielectric layer, and the seal ring 304 elements are formed in the same process step as the conductive elements 306.

In another embodiment, the seal ring 304 may be formed after the conductive elements 306 are formed or after the RDL 302 itself is formed. In such an embodiment, the seal ring 304 may be formed from one or more metal layers that are formed in a channel etched in the RDL 302 after all of the dielectric layers are formed. Alternatively, the seal ring 304 may be formed from metal elements that are formed as each dielectric layer is formed, but in a process step separate from forming the conductive elements 306. In an embodiment, the seal ring 304 extends from the top surface of the RDL 302 to the substrate 102. In other embodiments, the seal ring 304 stops in the RDL 302 before the substrate 102, with at least a portion of the dielectric disposed between the substrate 102 and the seal ring 304.

Figure 4:
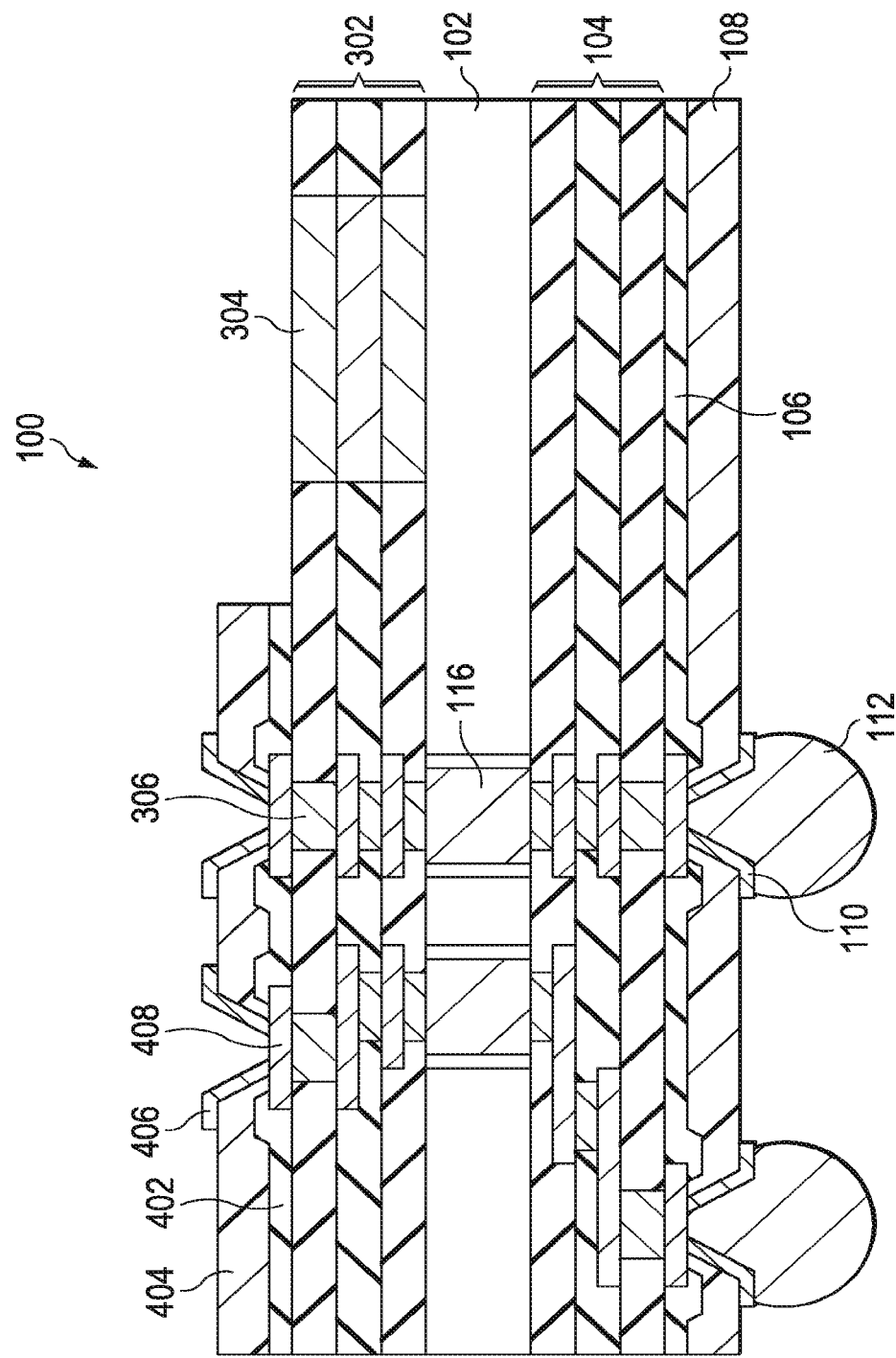

FIG. 4 is a cross-sectional view illustrating formation of a protective layer 404 and UBMs 406 on the workpiece 100 according to an embodiment. Lands 408 are formed on the RDL 302 and connected to the conductive elements 306. A passivation layer 402 and protective layer 404 are formed on the RDL 302, with openings exposing the lands 408. In an embodiment, UBMs 406 are formed over the lands 408 in the openings in the passivation layer 402 and the protective layer 404. The lands 408, passivation layer 402, protective layer 404 and UBMs 406 are formed according to the processes described above with respect to FIG. 1.

The passivation layer 402 and protective layer 404 are illustrated here as stopping between the lands 408 and the seal ring 304. However, this arrangement is merely exemplary and is not intended to be limiting. In an embodiment, the passivation layer 402 and the protective layer 404 may be formed by masking and deposition, or formed from a photosensitive material that is exposed with a pattern, developed and partly stripped to expose the seal ring 304 or to expose both the seal ring 304 and a portion of the RDL 302 surface. In other embodiments, the seal ring 304 extends above the surface of the RDL 302 and the passivation layer 402 and/or protective layer 404 are formed around the seal ring 304. In other embodiments, the passivation layer 402 and/or protective layer 404 are patterned with an opening over the seal ring 304. In such an embodiment, a metal feature is formed in the opening to extend the height of the seal ring 304 to at least the top surface of then passivation layer 402 or the protective layer 404.

Figure 5:
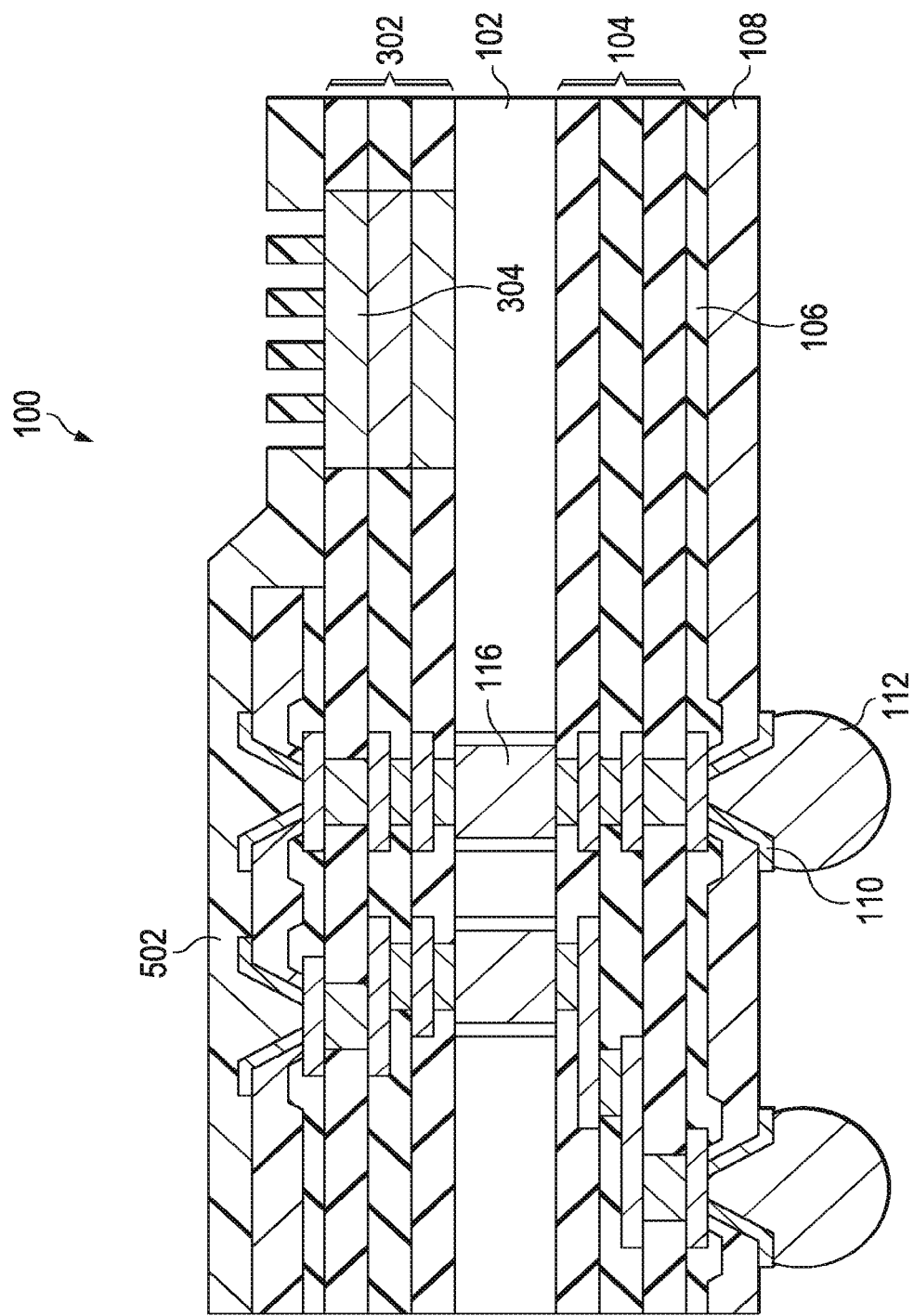

FIG. 5 is a cross-sectional view illustrating masking and shaping of the seal ring 304 according to an embodiment. A mask 502 is formed and patterned over the seal ring 304, and the seal ring 304 is etching using the mask 502. In an embodiment, the mask 502 is a photoresist that is spun on, and then patterned and developed to leave openings in the mask 502 over the seal ring 304. The seal ring 304 is etched to create grooves 602 (See, e.g. FIG. 6) in the seal ring 304 according to the pattern of the mask 502. For example, where the seal ring 304 is copper the seal ring 304 is wet etched using an acid such as phosphoric acid, nitric acid, hydrochloric acid, or with another etchant. Where the seal ring, is, for example, aluminum, the seal ring 304 may be wet etched using phosphoric acid, hydrochloric acid, hydrofluoric acid or another etchant, or the seal ring 304 may be plasma etched with phosphoric acid, acetic acid nitric acid, a combination of the same or another etchant.

Figure 6:
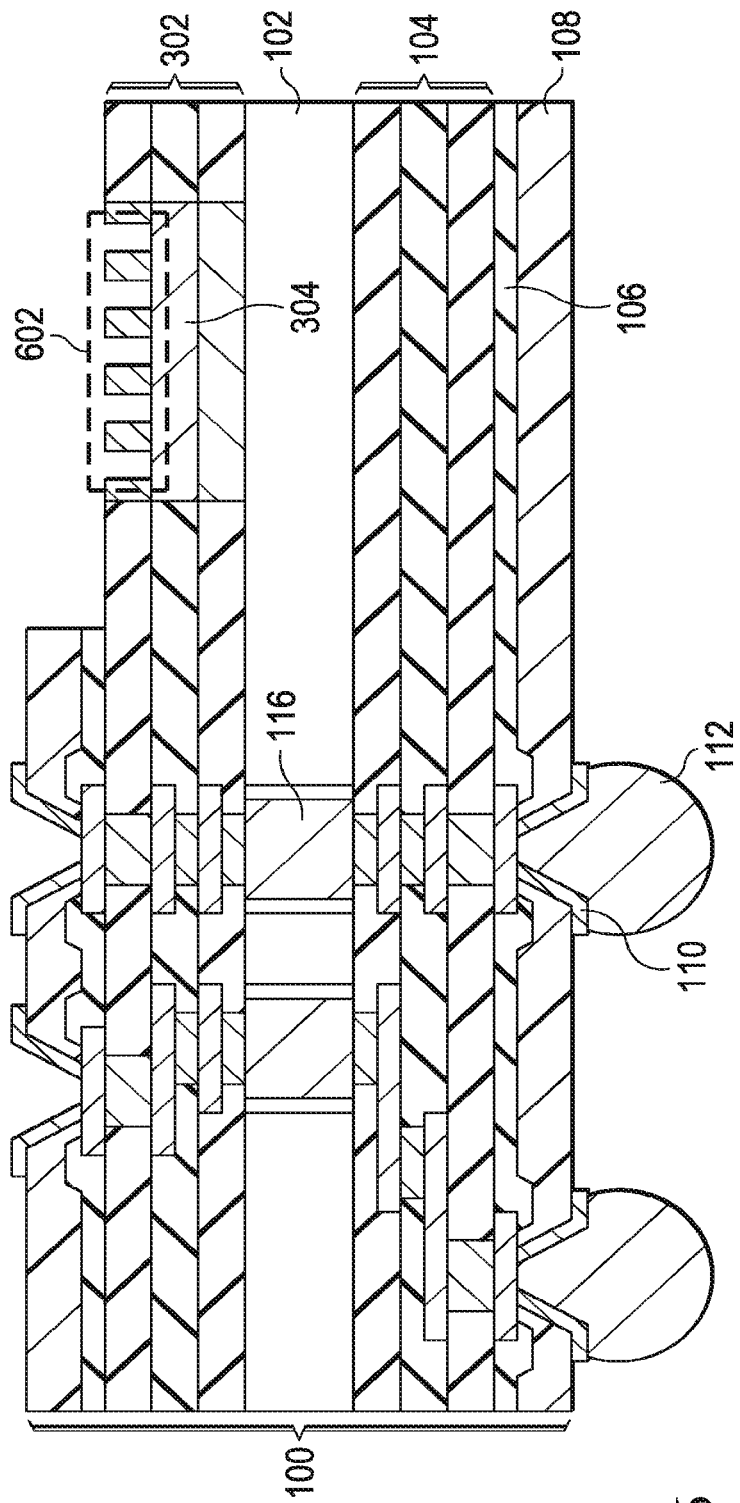

FIG. 6 is a cross-sectional view illustrating the shaped or etched seal ring 304 with grooves 602 according to an embodiment. In an embodiment, the seal ring 304 is anisotropically etched, resulting in grooves 602 with substantially square bottoms. In other embodiment, the grooves are created with a subtractive process such as ion milling or with an additive process such as, for example, forming ridges defining the grooves 602 by depositing material over a patterned mask and then removing the mask. In an embodiment, the grooves 602 are substantially concentric with each other and border the workpiece 100 in the seal ring 304.

It has been discovered that formation of grooves 602 in the seal ring 304 and bordering the workpiece 100 creates an improved seal when a thermal interface material (TIM) is applied over the grooves 602 of the seal ring 304. The grooves 602 in the seal ring 304 increase the surface area of the region where the TIM contacts the seal ring 304 and prevents underfill inside or outside the seal ring 304 from flowing between the TIM and the seal ring 304 during subsequent processing and use. In an embodiment, 1 or more grooves 602 are formed in the seal ring 304. Additionally, 2 to 8 grooves 602 in the seal ring 304 have been discovered to be critical to providing advantageous clamping and sealing of the TIM to the seal ring 304. A width between about 2 μm and about 30 μm and a depth of between about 1 μm and about 50 μm for each of the grooves 602 is critical to provide advantageous joining of the grooves 602 and seal ring 304 to the TIM.

Figure 7:
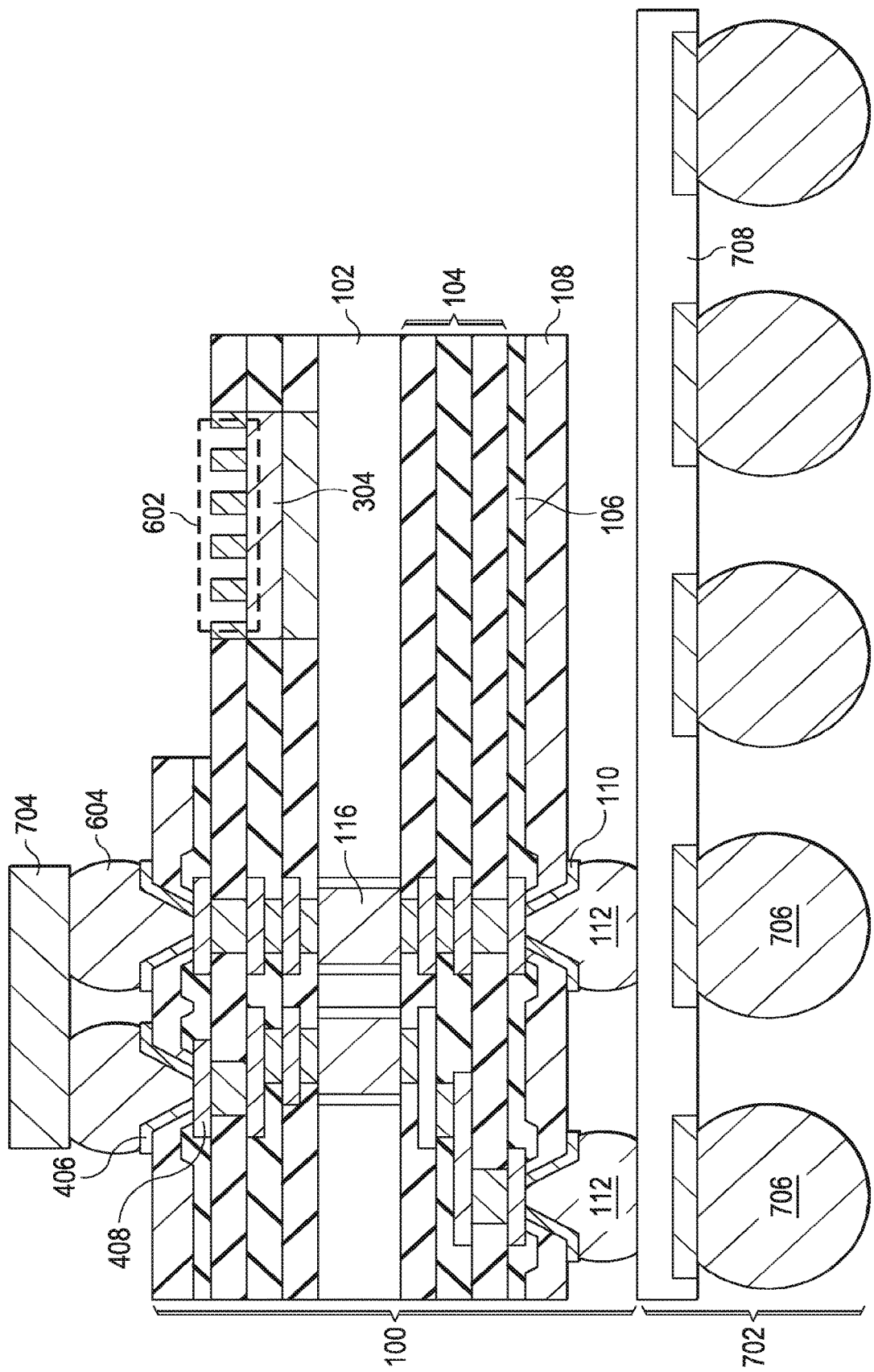

FIG. 7 is a cross-sectional view illustrating mounting a die 704 on the workpiece 100 and mounting the workpiece 100 on a package carrier 702 according to an embodiment. A die 704 is attached to the UBMs 406 and electrically connected to the lands 408 by way of connectors 604 such as solder balls, studs, bumps or the like. In some embodiments the die 704 is a package, substrate, board, carrier, multiple dies, or another structure. Where the workpiece 100 is part of a larger group of workpieces, such as on a wafer, the workpiece 100 is be cut or diced to singulate the workpiece.

The workpiece 100 is also mounted to a package carrier 702 by attaching the connectors 112 to the package carrier 702. The package carrier 702 may comprise at least a package substrate 708 and package connectors 706 disposed on the opposite side of the package carrier 702 from the workpiece 100. In an embodiment, the package substrate 708 has one or more interconnections disposed therein permitting the die 704 and/or the workpiece 100 to be in electrical signal communication with the package connectors 706. The package connectors 706 are configured to permit mounting of the completed device on another board, die, substrate carrier or package.

In an embodiment, the workpiece 100 is, for example, a processor, and the die 704 is one or more memory dies. In such an embodiment, the workpiece 100 may be in signal communication with the die 704 so that the workpiece 100 may fetch data or instructions from the die 704. The package carrier 702 may be a carrier having a layout or pitch of package connectors 706 different from the layout or pitch of the connectors 112, with the package carrier 702 connecting the processor of the workpiece 100 for communication with a PCB (not shown). In other embodiments, the die 704 is, for example, a dedicated signal processing or video processing die, while the workpiece 100 is a general processor that offloads a portion of processing load to the die 704. It should be understood that the foregoing examples are not intended to be limiting, and that the die 704 and workpiece 100 may each be any type of die, chip, memory, processor, package or other device.

Figure 8:
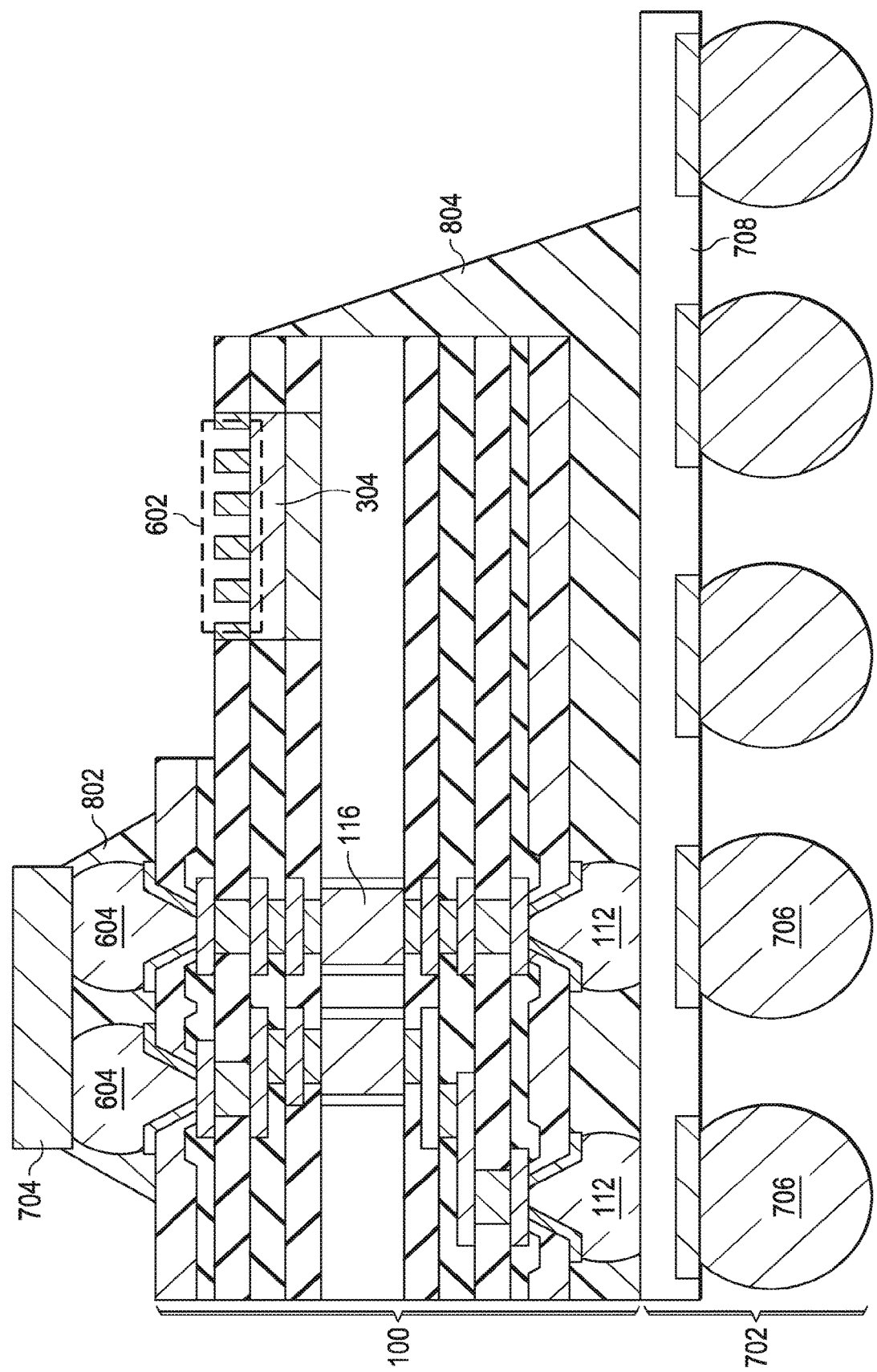

FIG. 8 is a cross-sectional view illustrating applying package underfill 802 and workpiece underfill 804 according to an embodiment. The package underfill 802 is applied between the die 704 and the workpiece 100, and the workpiece underfill 804 is applied between the workpiece 100 and the package carrier 702. In an embodiment the package underfill 802 and workpiece underfill 804 are form from, for example, an epoxy, a polyimide, a polymer, or another insulating material. The package underfill 802 and workpiece underfill 804 are applied as a gel or liquid and may be forced into the spaces around the respective connectors 604 and 112, and then subsequently cured. In an embodiment, the package underfill 802 and workpiece underfill 807 avoids the grooves 602 of the seal ring 304 to prevent the underfills 802 and 804 from interfering with TIM application (See, e.g., FIG. 9).

Figure 9:
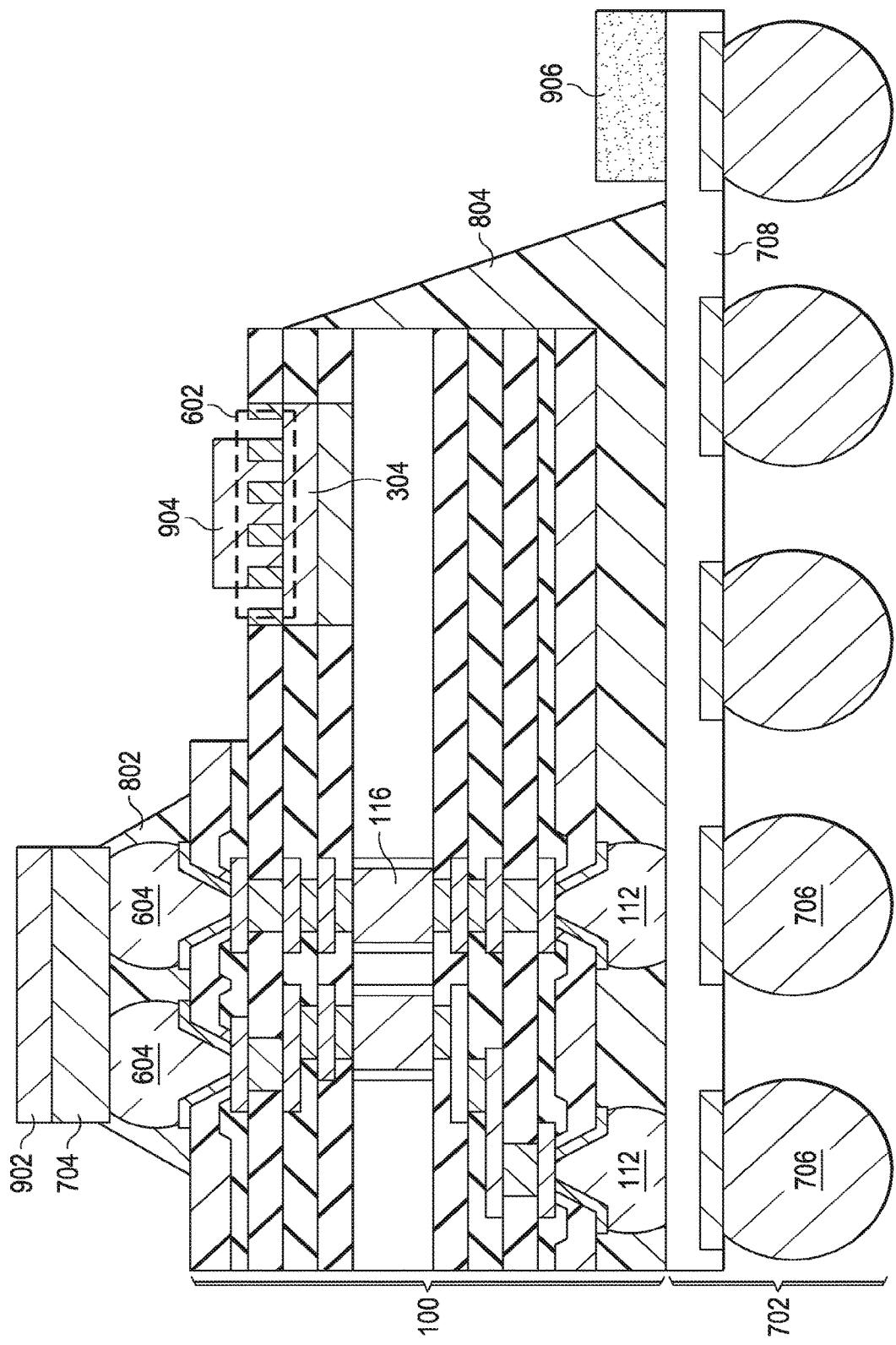

FIG. 9 is a cross-sectional view illustrating applying thermal interface materials (TIMs) 902 and 904 according to an embodiment. A package TIM 902 and workpiece TIM 904 are applied to the die 704 and seal ring 304, respectively. An adhesive 906 is also applied to the package carrier 702. The TIMs 902 and 904 are structures that fill air gaps or imperfections in surfaces to provide a thermal sink for heat generated by those surfaces. In the illustrated embodiment, package TIM 902 is applied to the top surface of the die 704 and permits the transmission of heat from the die 704. The workpiece TIM 904 is applied to the seal ring 304 and permits transmission of heat from the workpiece 100.

In an embodiment, the TIMs 902 and 904 are thermally conductive gels, pastes, pads, greases, or phase change materials with the greatest possible thermal conductivity, typically between about 0.5 W/(m·K) and about 10 W/(m·K). For example, a thermal grease may be a ceramic or metal, such as beryllium oxide, aluminum nitride, aluminum oxide, zinc oxide, silver, aluminum, or the like, suspended in a silicone-based gel. In other examples, TIMS 902 and 904 may be a liquid metal paste of gallium alloys, or a metal alloy pad that is reflowed to adhere the TIM material to a surface.

Figure 10:
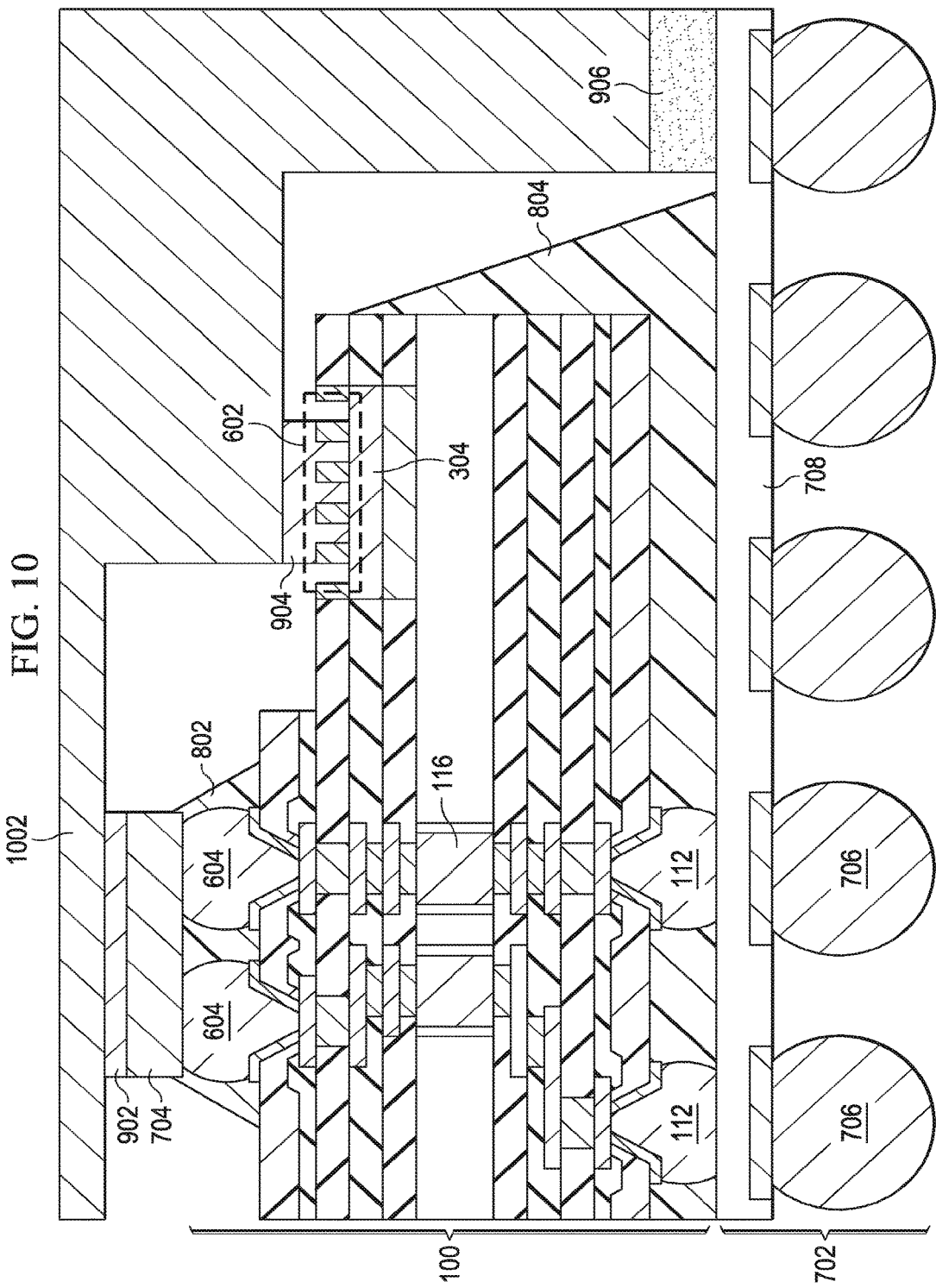

FIG. 10 is a cross-sectional view illustrating applying a lid 1002 according to an embodiment. The workpiece 100 and die 704 fit within a recess of the lid 1002. The lid 1002 is adhered to the package carrier 702 by the adhesive 906. The TIMs 902 and 904 provide additional adhesion for the lid 1002. The lid 1002 is a structure that acts, in an embodiment, as a heat sink, with the interior surface of the lid 1002 contacting the package TIM 902 and workpiece TIM 904. After application of the lid 1002, the workpiece TIM 904 substantially fills the grooves 602 under the workpiece TIM 904, providing a thermal interface between the seal ring 304 and the lid 1002.

It has been found that the grooves 602 filled with workpiece TIM 904 enhance clamping force between the lid 1002 and workpiece 100 and prevents delamination of the lid 1002 from the workpiece 100. Additionally, after application of the lid 1002, the grooves 602 and workpiece TIM 904 prevent bleeding of the package underfill 802 between the lid 1002 and seal ring 304 from slumping or migration due to processing, vibration, high temperatures or other adverse conditions. The grooves 602 and workpiece TIM 904 also prevent the workpiece underfill 804 from creeping over the top surface of the workpiece 100 and infiltrating between the lid 1002 and seal ring 304.

In an embodiment, the lid 1002 is a heat conductive material such as aluminum, copper, or the like. Heat from the die 704 and workpiece 100 is transferred to the lid by way of the TIMs 902 and 904. The lid 1002 dissipates the heat of the die 704 and the workpiece 100, permitting those devices to operate at higher speeds and with less thermal stress. In the illustrated embodiment, the workpiece TIM 904 is applied to cover a portion of the seal ring 304, leaving one or more grooves 602 less than completely filled. However, at least one of the grooves 602 is filled with the workpiece TIM 904.

Figure 11A:
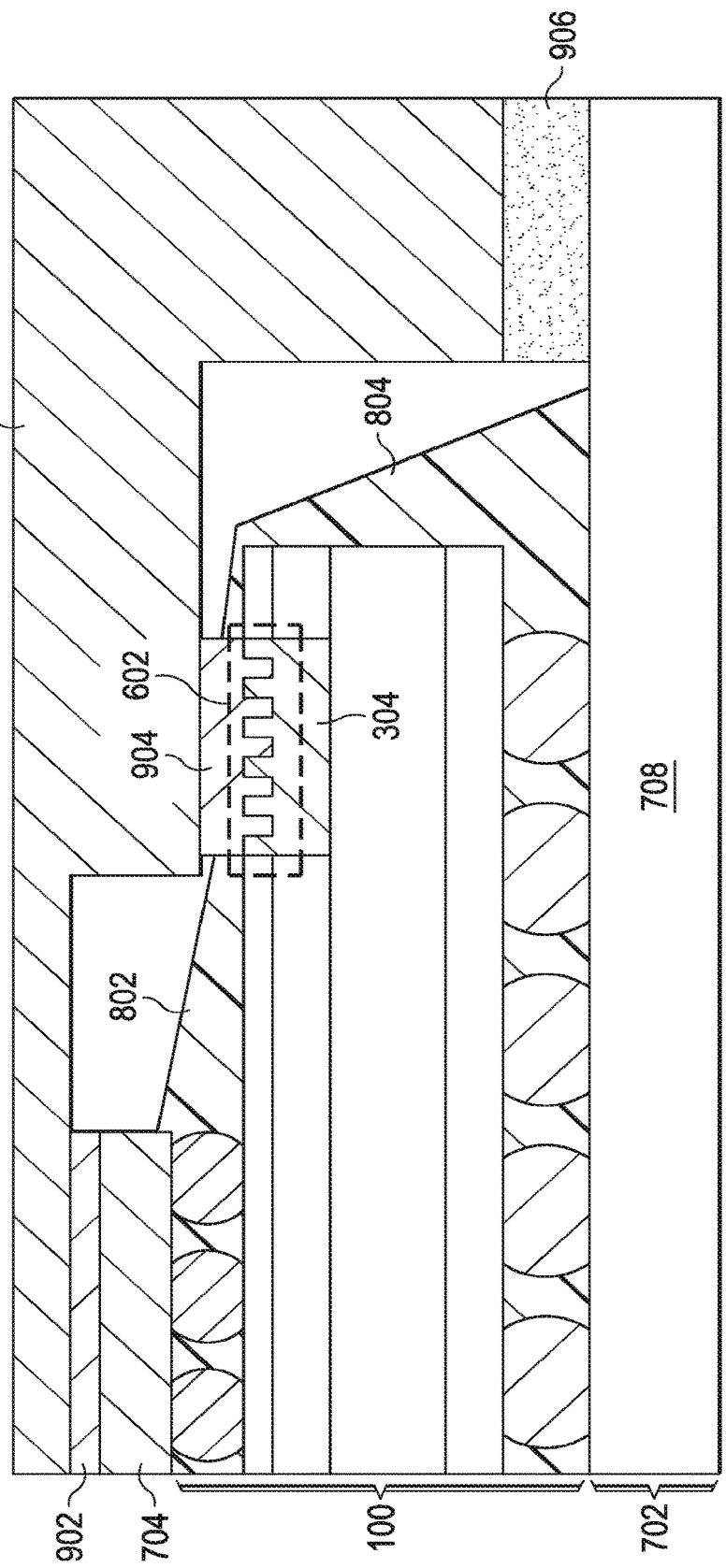

FIG. 11A illustrates an alternative embodiment of the workpiece TIM 904 as applied to the seal ring 304. In such an embodiment, the workpiece TIM 904 may completely cover, or substantially cover, all of the seal ring 304, substantially filling all of the grooves 602. FIG. 11A also shows the workpiece TIM 904 preventing the package underfill 802 and workpiece underfill 804 from infiltrating between the seal ring 304 and lid 1002. In such an embodiment, the workpiece TIM 904 separates the package underfill 802 and workpiece underfill 804 on the surface of the workpiece 100.

Figure 11B:
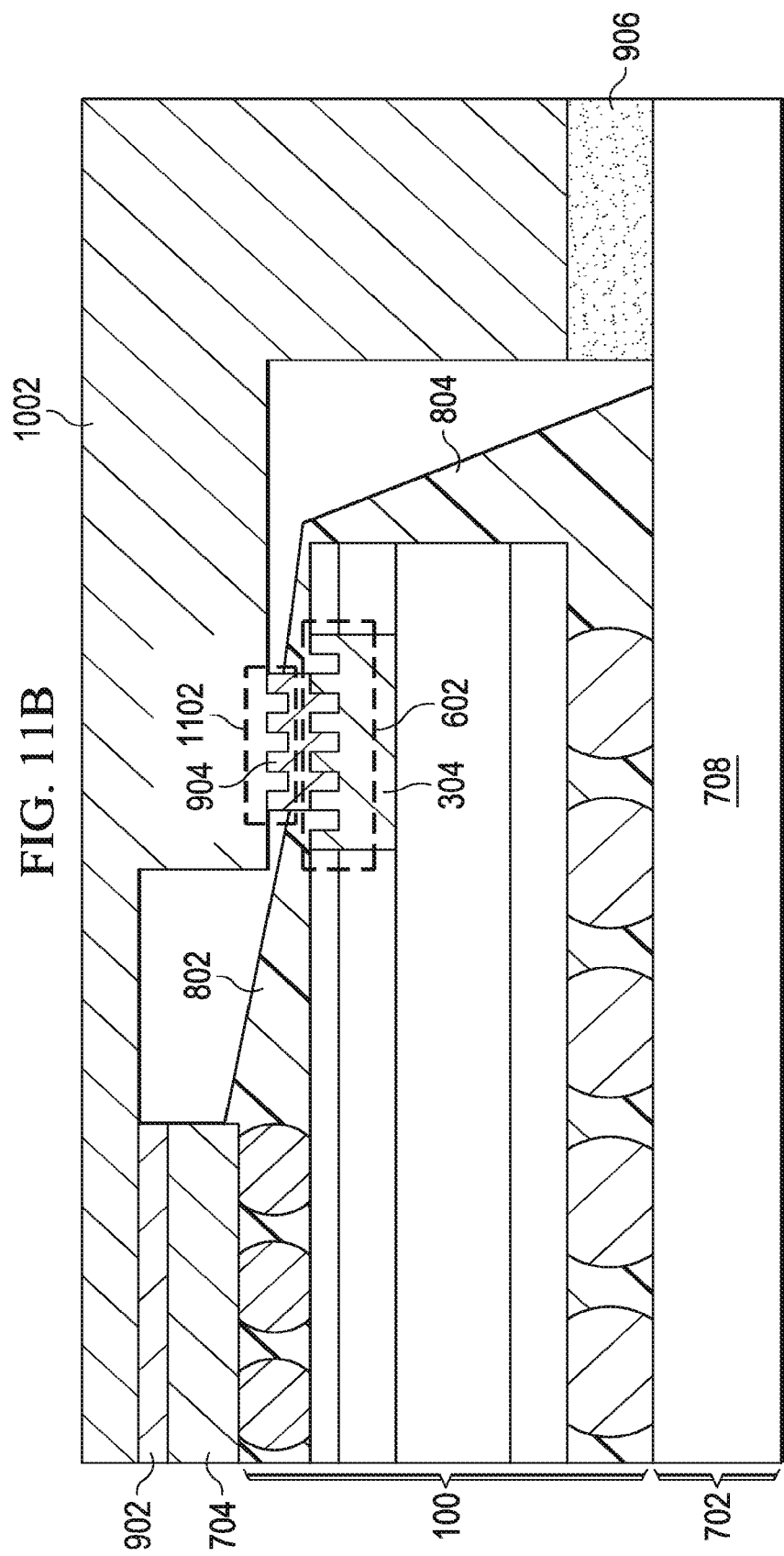

FIG. 11B illustrates an alternative embodiment of the lid 1002 interface with the workpiece TIM 904. In an embodiment, the bond between the lid 1002 and the workpiece TIM 904 is enhanced by ridges 1102 in the lid. The ridges 1102 may be milled or formed on the interior surface of the lid 1002, and may extend into the workpiece TIM 904 so that the workpiece TIM 904 fills the grooves between the ridges 1102. In an embodiment, ridges 1102 may complement the grooves 602 in the seal ring 304, with one ridge 1102 substantially aligned with, and sized similarly to, a respective groove 602. In an embodiment, the lid 1002 has a number of ridges 1102 matching the number of grooves 602 in the seal ring 304, and in other embodiments, the lid 1002 may have the same number, or more, ridges 1102 than the number of grooves 602 in the seal ring 304. While the ridges 1102 of the lid 1002 are illustrated here as substantially "U" shaped or rectangular, it should be recognized that such shape is merely illustrative and not limiting, and that the ridges 1102 may have other shapes.

FIG. 11c illustrates an alternative embodiment of the lid 1002 interface with the workpiece TIM 904. The lid 1002 may be formed with "V" shaped, or triangular ridge 1104.

Figure 12:
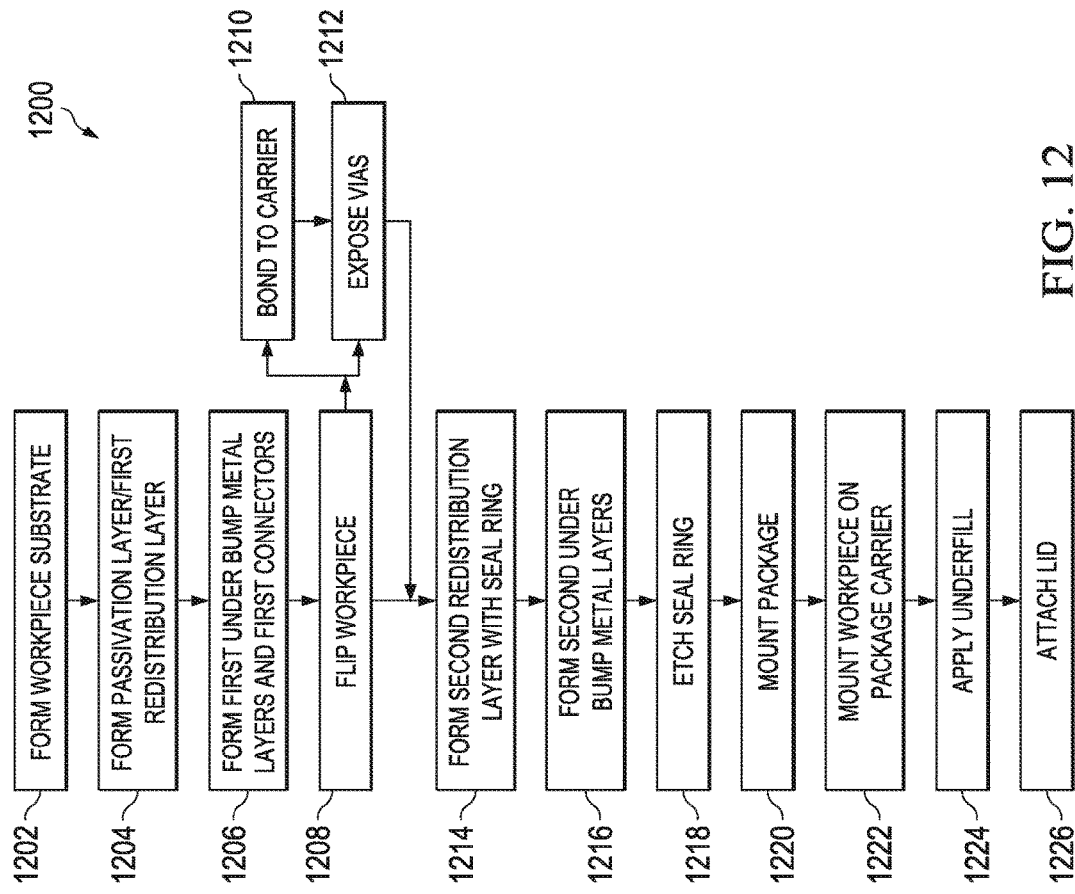
FIG. 12 is a flow diagram illustrating a method of forming a workpiece with a shaped seal ring according to an embodiment.

FIG. 12 is a flow diagram illustrating a method 1200 of forming a workpiece with a shaped seal ring according to an embodiment. The workpiece comprising a die, wafer, substrate or other structure is formed in block 1202. A passivation layer and/or RDL is formed on a first side of the workpiece in block 1204, and UBMs and connectors are formed over the RDL on the first side of the workpiece in block 1206. The workpiece is flipped in block 1208, optionally bonded to a carrier in block 1210, and vias or other conductive structures in the substrate are optionally exposed at the second side of the workpiece in block 1212. A second RDL, including the seal ring, is formed on the second side of the workpiece in block 1214, and UBMs are formed over the second RDL in block 1216. The seal ring is masked and etched, or otherwise shaped, in block 1218. A package is mounted on the second side of the workpiece in block 1222 and the workpiece is mounted to the package carrier in block 1224. Underfill is applied between the package and workpiece and between the workpiece and package carrier in block 1224. An adhesive is applied to the package carrier and a lid is attached in block 1226.

Thus, according to an embodiment, a device having a shaped seal ring comprises a workpiece, the workpiece comprising at least one dielectric layer disposed on a first side of a substrate, a seal ring disposed in the at least one dielectric layer, and at least one groove in the seal ring. A lid is disposed over the workpiece, the workpiece extending into a recess disposed in the lid and a first thermal interface material (TIM) contacts the seal ring and a first surface of the recess in the lid, with the first TIM extending into the at least one groove. The lid comprises one or more ridges disposed in the recess and contacting the first TIM. The workpiece is mounted to the package carrier. A die is mounted over a first side of workpiece and disposed in the recess. A first underfill is disposed under the die and a second underfill is disposed between the workpiece and the package carrier. The first TIM is disposed between the first underfill and the second underfill.

A device according to another embodiment comprises a workpiece having a seal ring disposed in a first side and bordering the workpiece, wherein the seal ring has at least one groove disposed in a top surface, a lid disposed over the workpiece and having a recess in a first side, the workpiece extending into the recess and a first TIM disposed on the seal ring and extending into the at least one groove, the first TIM contacting a first surface of the recess in the lid. The seal ring has between about 4 and about 6 grooves. Each of the grooves has width between about 2 µm and about 30 µm and a depth of between about 1 µm and about 50 µm. The lid comprises one or more ridges disposed in the recess, the one or more ridges contacting the first TIM. The one or more ridges in the lid have a rectangular shape or a triangular shape. The ridges complement the grooves. A die is mounted over the first side of the workpiece by one or more connectors, the die in signal communication with the workpiece. A second TIM contacts a second surface of the recess in the lid and also contacts the die. The device further comprises a package carrier, and the workpiece is mounted to the package carrier by one or more connectors. An adhesive is disposed on a first surface of the package carrier, the adhesive adhering the lid to the package carrier. A first underfill is disposed between the die and the workpiece, and a second underfill disposed between the workpiece and the package carrier. The first TIM is disposed between the first underfill and the second underfill.

A method of forming a device according to an embodiment comprises forming a seal ring on a first side of a workpiece, forming at least one groove in the seal ring and bordering the workpiece, applying a first thermal interface material (TIM) to the seal ring and attaching a lid over the workpiece. The lid has a recess in a first side, the lid covering the workpiece with the workpiece extending into the recess, and a surface of the recess contacting the first TIM. After the attaching the lid, the first thermal interface material extends into the at least one groove. The method further comprises mounting a die over the first side of workpiece, the die in signal communication with the workpiece after the mounting the die, applying a first underfill between the die and the workpiece, and applying a second TIM to the die, the surface of the recess in the lid contacting the second TIM after the attaching the lid. The method also further comprises mounting the workpiece to a package carrier, applying a second underfill between the workpiece and the package carrier, and applying an adhesive to the package carrier. The attaching the lid comprises attaching a surface of the lid to the adhesive and the first TIM is disposed between the first underfill and the second underfill on the outside surface of the workpiece.

In an embodiment, a method includes forming a seal ring on a first side of a workpiece. At least one groove is formed in the seal ring. A first thermal interface material (TIM) is applied to the seal ring. A lid is attached over the workpiece. A first side of the lid has a recess. The lid covers the workpiece with the workpiece extending into the recess. A surface of the recess contacts the first TIM. The first TIM extends into the at least one groove after the lid is attached over the workpiece.

In another embodiment, a method includes forming a dielectric layer over a substrate. A recess is formed in the dielectric layer. The recess is filled with a conductive material to form a seal ring within the dielectric layer. The seal ring is patterned to form one or more grooves in the seal ring. A first thermal interface material (TIM) is applied to the seal ring. A lid is disposed over the seal ring. The first TIM thermally couples the lid to the seal ring. The first TIM fills the one or more grooves after the lid is disposed over the seal ring.

In yet another embodiment, a method includes forming a seal ring on a first side of a workpiece. The seal ring is etched to form at least one groove in the seal ring. A first thermal interface material (TIM) is applied to the seal ring. A second side of the workpiece is attached to a package carrier. The second side of the workpiece is opposite the first side of the workpiece. A lid is attached to the package carrier using an adhesive. The lid extends along a sidewall of the workpiece and over the seal ring. The first TIM thermally couples the lid to the seal ring. The first TIM fills the at least one groove after the lid is attached to the package carrier.

Although embodiments of the present disclosure and their advantages have been described in detail, it should be understood that various changes, substitutions and alterations can be made herein without departing from the spirit and scope of the disclosure as defined by the appended claims. For example, it will be readily understood by those of ordinary skill in the art that many of the features, functions, processes, and materials described herein may be varied while remaining within the scope of the present disclosure. Moreover, the scope of the present application is not intended to be limited to the particular embodiments of the process, machine, manufacture, and composition of matter, means, methods or steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   forming a seal ring on a first side of a workpiece, wherein forming the seal ring on the first side of the workpiece comprises:
   forming a dielectric layer over a substrate of the workpiece;
   forming a recess in the dielectric layer; and
   filling the recess with a conductive material to form the seal ring within the dielectric layer;
   forming at least one groove in the seal ring;
   applying a first thermal interface material (TIM) to the seal ring; and
   attaching a lid over the workpiece, a first side of the lid having a recess, the lid covering the workpiece with the workpiece extending into the recess, a surface of the recess contacting the first TIM, the first TIM extending into the at least one groove after attaching the lid over the workpiece.

2. The method of claim 1, further comprising:
   mounting a die over the first side of the workpiece, the die being in signal communication with the workpiece after mounting the die over the first side of the workpiece;
   applying a first underfill between the die and the workpiece; and
   applying a second TIM to the die, the surface of the recess in the lid contacting the second TIM after attaching the lid over the workpiece.

3. The method of claim 2, further comprising:
   mounting the workpiece to a package carrier;
   applying a second underfill between the workpiece and the package carrier; and
   applying an adhesive to the package carrier, wherein attaching the lid over the workpiece comprises attaching the lid to the adhesive, and wherein the first TIM is disposed between the first underfill and the second underfill on the first side of the workpiece.

4. The method of claim 3, wherein the first underfill extends along a first sidewall of the first TIM and the second underfill extends along a second sidewall of the first TIM, the first sidewall of the first TIM being opposite the second sidewall of the first TIM.

5. The method of claim 1, further comprising forming at least one ridge on the first side of the lid, wherein attaching the lid over the workpiece comprises aligning the at least one ridge with respect to the at least one groove.

6. The method of claim 1, wherein forming the at least one groove in the seal ring comprises patterning the seal ring to form the at least one groove in the seal ring.

7. A method comprising:
   forming a dielectric layer over a substrate;
   forming a recess in the dielectric layer;
   filling the recess with a conductive material to form a seal ring within the dielectric layer;
   patterning the seal ring to form one or more grooves in the seal ring;
   applying a first thermal interface material (TIM) to the seal ring; and
   disposing a lid over the seal ring, the first TIM thermally coupling the lid to the seal ring, wherein the first TIM fills the one or more grooves after disposing the lid over the seal ring.

8. The method of claim 7, further comprising forming one or more ridges on a first side of the lid, wherein the first TIM extends along sidewalls of the one or more ridges after disposing the lid over the seal ring.

9. The method of claim 8, further comprising aligning each of the one or more ridges to a respective one of the one or more grooves.

10. The method of claim 8, wherein a number of the one or more ridges is equal to a number of the one or more grooves.

11. The method of claim 7, further comprising:
attaching the substrate to a package carrier; and
forming a first underfill between the substrate and the package carrier, the first underfill extending along a sidewall of the substrate.

12. The method of claim 11, wherein disposing the lid over the seal ring comprises attaching the lid to the package carrier using an adhesive.

13. The method of claim 11, further comprising:
attaching a die to the substrate, the substrate being interposed between the die and the package carrier;
forming a second underfill between the die and the substrate; and
applying a second TIM to the die, the second TIM thermally coupling the lid to the die.

14. A method comprising:
forming a seal ring on a first side of a workpiece, wherein forming the seal ring on the first side of the workpiece comprises:
forming a dielectric layer over a substrate of the workpiece;
patterning the dielectric layer to form a recess; and
depositing a conductive material in the recess to form the seal ring within the dielectric layer;
etching the seal ring to form at least one groove in the seal ring;
applying a first thermal interface material (TIM) to the seal ring;
attaching a second side of the workpiece to a package carrier, the second side of the workpiece being opposite the first side of the workpiece; and
attaching a lid to the package carrier using an adhesive, the lid extending along a sidewall of the workpiece and over the seal ring, the first TIM thermally coupling the lid to the seal ring, wherein the first TIM fills the at least one groove after attaching the lid to the package carrier.

15. The method of claim 14, further comprising:
attaching a die to the first side of the workpiece, the die being electrically coupled to the workpiece; and
depositing a second TIM over the die, the second TIM thermally coupling the die to the lid.

16. The method of claim 15, further comprising forming a first underfill between the die and the workpiece.

17. The method of claim 16, further comprising forming a second underfill between the workpiece and the package carrier.

18. The method of claim 17, wherein the first underfill extends along a first sidewall of the first TIM and the second underfill extends along a second sidewall of the first TIM, the first sidewall of the first TIM being opposite the second sidewall of the first TIM.

19. The method of claim 1, wherein the first TIM has a thermal conductivity between about 0.5 W/(m·K) and about 10 W/(m·K).

20. The method of claim 14, wherein the at least one groove has a width between about 2 µm and about 30 µm and a depth between about 1 µm and about 50 µm.

* * * * *